US006768335B1

United States Patent
Young et al.

(10) Patent No.: US 6,768,335 B1
(45) Date of Patent: Jul. 27, 2004

(54) INTEGRATED CIRCUIT MULTIPLEXER INCLUDING TRANSISTORS OF MORE THAN ONE OXIDE THICKNESS

(75) Inventors: Steven P. Young, Boulder, CO (US); Michael J. Hart, Palo Alto, CA (US); Venu M. Kondapalli, Sunnyvale, CA (US); Martin L. Voogel, Los Altos, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/354,520

(22) Filed: Jan. 30, 2003

(51) Int. Cl.[7] .............................................. G06F 7/38
(52) U.S. Cl. ..................... 326/37; 326/113; 327/407; 327/408
(58) Field of Search ....................... 326/37–39, 48–49, 326/95, 113; 327/407–408

(56) References Cited

U.S. PATENT DOCUMENTS

| 5,744,995 | A | * | 4/1998 | Young .......................... 327/407 |
| 5,801,551 | A | * | 9/1998 | Lin .............................. 326/113 |
| 5,808,483 | A | * | 9/1998 | Sako ........................... 326/113 |
| 5,955,912 | A | * | 9/1999 | Ko .............................. 327/410 |
| 6,049,227 | A | * | 4/2000 | Goetting et al. ............... 326/80 |
| 6,373,291 | B1 | * | 4/2002 | Hamada et al. ............. 326/113 |
| 6,380,765 | B1 | * | 4/2002 | Forbes et al. ............... 326/112 |
| 6,392,467 | B1 | * | 5/2002 | Oowaki et al. ............. 327/427 |
| 6,448,809 | B2 | * | 9/2002 | Goetting et al. ............... 326/44 |
| 6,667,635 | B1 | * | 12/2003 | Pi et al. ........................ 326/40 |

OTHER PUBLICATIONS

Xilinx, Inc.; "Virtex–II Pro Platform FPGA Handbook"; published Oct. 14, 2002; available from Xilinx, Inc., 2100 Logic Drive, San Jose, California 95124; pp. 19–71.
U.S. patent application Ser. No. 10/354,587, Young et al., filed Jan. 30, 2003.

* cited by examiner

Primary Examiner—Michael Tokar
Assistant Examiner—Khai Nguyen
(74) Attorney, Agent, or Firm—Lois D. Cartier

(57) ABSTRACT

A multiplexer that can be used, for example, in a programmable logic device (PLD). The multiplexer includes a plurality of pass transistors passing a selected one of several input values to an internal node, which drives a buffer that provides the multiplexer output signal. The pass transistors can be controlled, for example, by values stored in memory cells of a PLD. The pass transistors have a first oxide thickness and are controlled by a value having a first operating voltage. The buffer includes transistors having a second and thinner oxide thickness, and is operated at a second and lower operating voltage. Where memory cells are used to control the pass transistors, the memory cells include transistors having the first oxide thickness and operate at the first operating voltage. Some embodiments also include transistors of varying gate length for each of the pass transistors, buffer transistors, and memory cell transistors.

46 Claims, 4 Drawing Sheets

US 6,768,335 B1

INTEGRATED CIRCUIT MULTIPLEXER INCLUDING TRANSISTORS OF MORE THAN ONE OXIDE THICKNESS

FIELD OF THE INVENTION

The invention relates to programmable logic devices (PLDS). More particularly, the invention relates to an interconnect multiplexer for a PLD that includes transistors having more than one oxide thickness.

BACKGROUND OF THE INVENTION

Programmable logic devices (PLDs) are a well-known type of digital integrated circuit that can be programmed to perform specified logic functions. One type of PLD, the field programmable gate array (FPGA), typically includes an array of configurable logic blocks (CLBs) and programmable input/output blocks (IOBs). The CLBs and IOBs are interconnected by a programmable interconnect structure.

More advanced FPGAs can include more than one type of logic block in the array. For example, the Xilinx Virtex-II Pro™ FPGA includes blocks of Random Access Memory (RAM), blocks implementing multiplier functions, and embedded processor blocks. (The Xilinx Virtex-II Pro FPGA is described in detail in pages 19–71 of the "Virtex-II Pro Platform FPGA Handbook", published October, 2002, available from Xilinx, Inc., 2100 Logic Drive, San Jose, Calif. 95124, which pages are incorporated herein by reference.)

The CLBs, IOBs, interconnect, and other logic blocks are typically programmed by loading a stream of configuration data (bitstream) into internal configuration memory cells that define how the CLBs, IOBs, and interconnect are configured. The configuration data can be read from memory (e.g., an external PROM) or written into the FPGA by an external device. The collective states of the individual memory cells then determine the function of the FPGA.

The programmable interconnect structure typically includes a large number of interconnect lines of various lengths interconnected by programmable interconnect points (PIPs). These PIPs are controlled by configuration memory cells. Thus, the values stored in the PIP configuration memory cells determine the "routing", i.e., the interconnections between various points in the FPGA. PIPs can also be used to select a signal from one of several interconnect lines and to pass the selected signal to a CLB, for example, or to select one of several output signals from a CLB to pass to an interconnect line.

A PIP can be implemented in various ways. For example, a set of PIPs can be implemented as a multiplexer structure that selects one of several interconnect lines and drives a signal on the selected interconnect line onto a destination interconnect line. One such set of PIPs is shown in FIG. 1.

As shown in FIG. 1, multiplexer structure 100 includes eight input terminals driven by eight input signals IN0–IN7. (In the present specification, the same reference characters are used to refer to terminals, signal lines, and their corresponding signals.) Each signal passes through an N-channel transistor T0–T7 controlled by an associated configuration memory cell M0–M7. Each configuration memory cell Mx includes, for example, a pair of cross-coupled inverters A, B, with inverter B driving the associated transistor T0–T7. Two pass transistors d1, d2 allow the configuration logic (not shown) to access the memory cell. Based on the data stored in memory cells M0–M7, one of signals IN0–IN7 is selected and passed to internal signal INT. Internal signal INT is passed to buffer 101, which provides output signal OUT at an output terminal of the multiplexer structure.

FIG. 1 illustrates one well-known implementation 101x of buffer 101. Buffer 101x includes two inverters coupled in series. The first inverter includes P-channel transistor P1 (the pullup) and N-channel transistor N1 (the pulldown), coupled in series between power high VDD and ground GND. Optional second inverter I2 can increase the performance of the buffer and ensures that the output signal OUT has the same sense as the input signal INT. P-channel transistor P2 is driven by the node N between the two inverters, and acts to pull node INT up to VDD such that pullup P1 is fully turned off. Optional P-channel transistor P3 is used to initialize node INT to a high value, for example during reset or power-up of the FPGA.

The structure shown in FIG. 1 works well at sufficiently high values of VDD (power high, or the operating voltage of the FPGA). For example, for many years VDD was standardized at 5 volts (5 V), plus or minus ten percent (10%). (The ten percent allowable variation was included in the specifications of each device to allow for normal deviations in manufacturing and operation.) However, operating voltages are being steadily reduced both to save power and to meet the requirements of smaller and smaller transistors. For example, a transistor with a thinner oxide layer breaks down at a lower gate voltage than a transistor with a thicker oxide layer. Thus, values of VDD have been reduced to 2.5 V, 1.8 V, and even as low as 1.5 V. A VDD value of 1.2 V is now contemplated, and at these low voltage levels the structure of FIG. 1 might no longer be adequate, as is now described in conjunction with FIG. 2.

When a high value is passed through an N-channel transistor, the voltage is reduced by Vt, the threshold voltage level of the N-channel transistor. (For purposes of simplifying the present discussion, other well-known transistor effects such as the body effect are not described.) For example, FIG. 2 shows an input signal IN passing through transistor T (which is driven by VDD) to internal node INT. Internal node INT drives buffer 201, which provides the output signal OUT. When input signal IN is at the same voltage level as VDD, the voltage at internal node INT is the gate voltage reduced by one threshold voltage (VINT=VDD−Vt).

This well-known limitation presents no problem when VDD=5 V, as described above. When processes supporting this operating voltage are used, the N-channel threshold voltage is less than one volt (1 V). Thus, the voltage at internal node INT is still more than four volts (4 V), which is quite sufficient to turn on the N-channel pulldown N1, thus turning on P-channel pullup P2 in buffer 201 (see FIG. 1). However, at sufficiently low levels of VDD, the voltage at internal node INT is so low as to impair the performance of the circuit.

For example, if node INT does not rise sufficiently high, the N-channel pulldown in buffer 201 might not be completely on, and the P-channel pullup P2 might not be sufficiently on to quickly turn off pullup P1. Thus, the pullup (e.g., pullup P1) "fights" the pulldown (e.g., pulldown N1), and slows down the switching of the output node. For example, referring again to FIG. 1, while P-channel transistor P2 helps in raising node INT to VDD once node N goes low, transistor P2 is no help if node N does not go low enough to turn it on.

As described, there is a voltage drop when a high voltage is passed across an N-channel transistor. However, there is no corresponding voltage drop of a high voltage across a P-channel transistor. Therefore, one solution to this problem is to replace the N-channel transistor with paired N- and P-channel transistors, with the P-channel transistors being driven by the complementary input signal. However, this solution can double the size of the multiplexer by doubling the number of pass transistors. Further, both the true and complement signals must be provided to the paired transistors, which increases the die area. Larger buffers must also be provided to handle the increased load of driving both the N- and P-channel transistors.

Another way to accommodate lower VDD levels is to drive the gates of the N-channel transistors with a voltage level VGG higher than VDD, as shown in FIG. 3 and Table 1. In this case, the voltage level after passing a high value VDD through the N-channel transistor T is the gate voltage VGG minus the N-channel threshold voltage Vt, or VINT= VGG−Vt. voltage level VGG is often specified for an FPGA, where VGG is the maximum voltage that can safely be applied to the gate of a transistor in the device. The VGG voltage level is at least partially determined by the oxide thickness of the transistor. Generally speaking, the thicker the layer of oxide over the transistor, the higher the voltage level that can be applied to the gate without damaging the transistor. Additionally, the maximum operating voltage level is generally determined by the total area of gate oxide exposed to the operating voltage. Therefore, the VGG used for a portion of the transistors in an integrated circuit can be higher than the VDD applied to the majority of transistors. Additionally, the longer the gate length (channel length) of the transistor, the less leakage current (i.e., off state current) occurs across the transistor from source to drain. Therefore, up to an intrinsic limit, the longer the gate length, the higher the voltage level that can be applied across the source and drain of the transistor without producing an unacceptably high leakage current.

However, FPGA manufacturers are not only reducing operating voltage levels on their devices, but are also reducing minimum feature sizes to lower costs. Sometimes, each new product generation uses a lower operating voltage and has reduced feature sizes. Reduced feature sizes mean thinner oxide and shorter gate lengths. Therefore, specified values of VGG are being rapidly reduced. For example, Table 1 shows the relationships between various exemplary values of VDD (the operating voltage), VGG (the maximum allowable gate voltage), Vt (the N-channel threshold voltage), and VINT (the voltage at node INT). Also included are typical gate lengths for each manufacturing process. All of the values shown in Table 1 are merely exemplary, as they vary between processes and manufacturers. VDD values are specified as nominal operating voltages.

TABLE 1

| VDD | VGG | Vt | VINT = VGG − Vt | Gate Length |
| --- | --- | --- | --- | --- |
| 5.0 V | 7+ V | 0.7 V | >5 V | 0.5+ micron |
| 2.5 V | 2.7 V | 0.6 V | 2.1 V | 0.25 micron |
| 1.5 V | 1.6 V | 0.55 V | 1.05 V | 0.12 micron |
| 1.2 V | 1.3 V | 0.5 V | 0.8 V | 0.08 micron |

Note that as VGG approaches twice the threshold voltage (VGG=2Vt), the voltage at node INT becomes insufficient to adequately turn on pulldown N1 (see FIG. 1). Therefore, it is desirable to provide alternative structures for implementing PIPs in FPGAs that can accommodate a lower operating voltage and smaller feature sizes than known structures. It is further desirable to provide multiplexers having the same characteristics that can be used for any purpose in other integrated circuits.

SUMMARY OF THE INVENTION

The invention provides a multiplexer structure that can be used, for example, in the programmable interconnect points (PIPs) of a programmable logic device (PLD). The structure includes transistors of varying oxide thickness, operating voltage, and, in some embodiments, gate length.

The multiplexer includes a plurality of pass transistors passing a selected one of several input values to an internal node, which drives a buffer providing the multiplexer output signal. The pass transistors can be controlled, for example, by values stored in memory cells of a PLD. The pass transistors have a first oxide thickness and are controlled by a value having a first operating voltage. The buffer includes transistors having a second oxide thickness thinner than the first oxide thickness, and operates at a second operating voltage lower than the first operating voltage. In some embodiments, the second operating voltage is the operating voltage used as a supply voltage by a majority of the transistors in the PLD. Where memory cells are used to control the pass transistors, the memory cells operate at the first operating voltage and include transistors having the first oxide thickness.

In some embodiments, the gate length also varies between the pass transistors, buffer transistors, and memory cell transistors. To support the higher operating voltage with acceptable leakage, the memory cells have the longest gate length. The buffer transistors, on the other hand, operate at the lower voltage (with thinner oxide) and can have the shortest gate length without generating unacceptable leakage current. The pass transistors are gated by the higher voltage and thus require the thicker oxide. However, the drain-to-source voltage for the pass transistors is less than the higher operating voltage, so the gate length of the pass transistors can be somewhere between the longest and shortest gate lengths without generating unacceptable leakage current.

In other embodiments, the pass transistors and memory cell transistors have a first and longer gate length, while the buffer transistors have a second and shorter gate length. In yet other embodiments, the gate lengths are the same for the pass transistors, buffer transistors, and memory cell transistors.

According to some embodiments, a multiplexer structure in an integrated circuit (IC) includes a plurality of pass transistors coupled between a plurality of input terminals and an internal node, and a buffer coupled between the internal node and an output terminal. Each of the pass transistors has a gate terminal coupled to provide to the pass transistor a selected one of a ground signal and a power high signal at a first voltage level. Each of the pass transistors has a first oxide thickness. The buffer is coupled to an operating voltage at a second voltage level less than the first voltage level. The buffer comprises buffer transistors having a second oxide thickness, where the second oxide thickness is less than the first oxide thickness. In some embodiments, the multiplexer structure also includes a plurality of memory cells controlling the pass transistors, operating at the first voltage level, and having the first oxide thickness.

In some embodiments, the IC is a PLD such as a field programmable gate array (FPGA). In some such embodiments, the multiplexer structure is used to implement programmable interconnect points (PIPS) in the FPGA. In other embodiments, the IC is a non-programmable integrated circuit.

According to some embodiments, a circuit comprises a pass transistor coupled between an input terminal and an internal node and a buffer coupled between the internal node and an output terminal. The pass transistor has a first oxide thickness and a gate terminal coupled to provide to the pass transistor a selected one of a ground signal and a power high signal at a first voltage level. The buffer comprises buffer transistors having a second oxide thickness less than the first oxide thickness, and is coupled to an operating voltage at a second voltage level less than the first voltage level. In some embodiments, the circuit also includes a memory cell controlling the pass transistor, operating at the first voltage level, and having the first oxide thickness.

According to some embodiments, an interconnect structure for a PLD includes a plurality of interconnect lines and a first plurality of PIPs coupled between the interconnect lines. Each of the first plurality of PIPs comprises a plurality of input terminals coupled to a subset of the interconnect lines and an output terminal coupled to one of the interconnect lines. Each set of PIPs is implemented in a manner substantially similar to the multiplexer structure as described above.

According to some embodiments, an FPGA comprises a plurality of configurable logic blocks, a plurality of interconnect lines, and a plurality of PIPs coupled between the interconnect lines and the configurable logic blocks. Each set of PIPs is implemented in a manner substantially similar to the multiplexer structure as described above.

BRIEF DESCRIPTION OF THE DRAWINGS

The present invention is illustrated by way of example, and not by way of limitation, in the following figures.

DETAILED DESCRIPTION OF THE DRAWINGS

The present invention is believed to be applicable to a variety of integrated circuits, including but not limited to programmable logic devices (PLDs). The present invention has been found to be particularly applicable and beneficial when applied to field programmable gate arrays (FPGAs), and in particular to programmable interconnect points (PIPs) in FPGAs. While the present invention is not so limited, an appreciation of the present invention is presented by way of specific examples, which in this instance are directed to such FPGA PIPs.

In the following description, numerous specific details are set forth to provide a more thorough understanding of the present invention. However, it will be apparent to one skilled in the art that the present invention can be practiced without these specific details.

Figure 4:
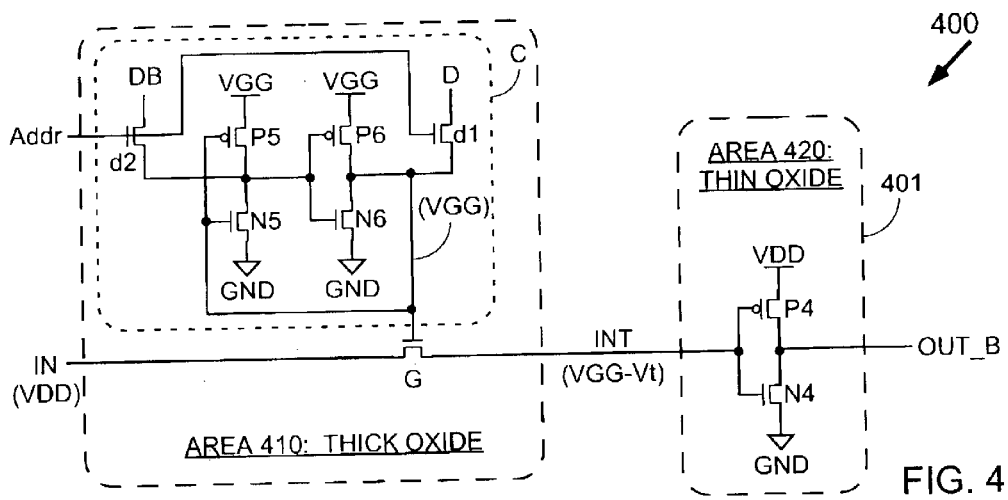
FIG. 4 shows a pass gate/buffer circuit that includes transistors having two different oxide thicknesses according to an embodiment of the invention.

FIG. 4 illustrates a circuit 400 according to one embodiment of the invention. Circuit 400 includes an input terminal IN coupled to a first data terminal of pass transistor G (in the pictured embodiment an N-channel transistor). Pass transistor G has a gate terminal coupled to receive an output signal from a memory cell C. Coupled to the second data terminal of pass transistor G (via internal node INT) is a buffer 401.

Figure 1:
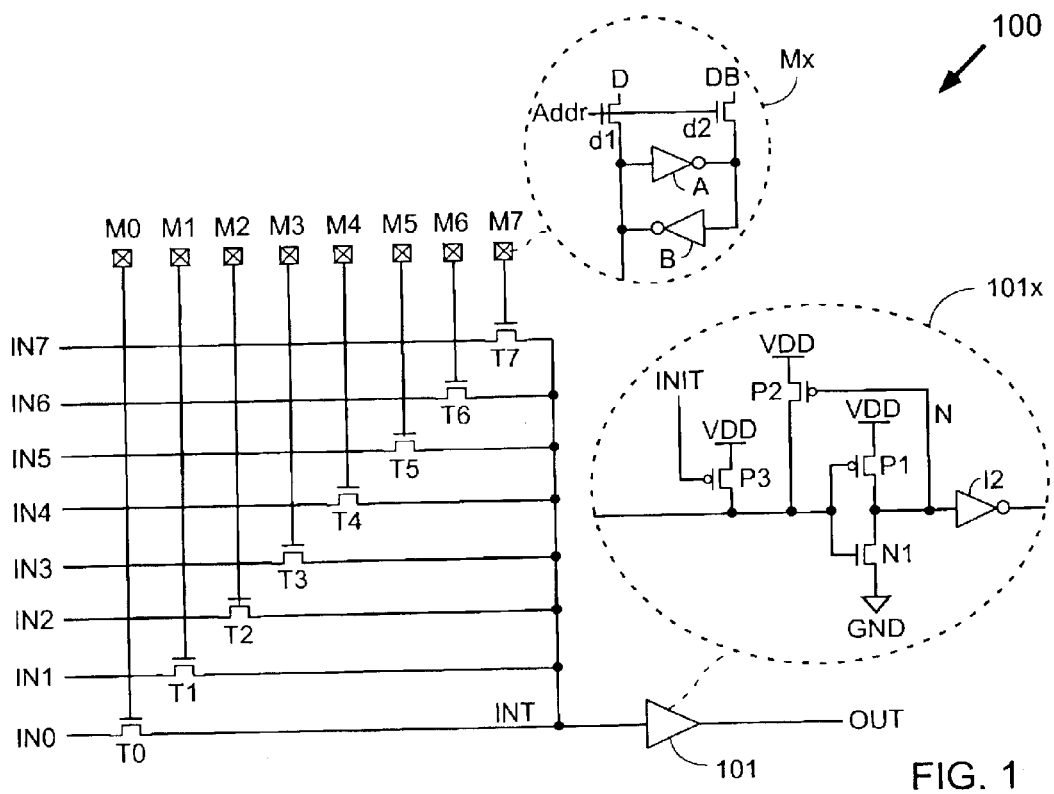
FIG. 1 shows a known programmable multiplexer structure for an FPGA.
Figure 2:
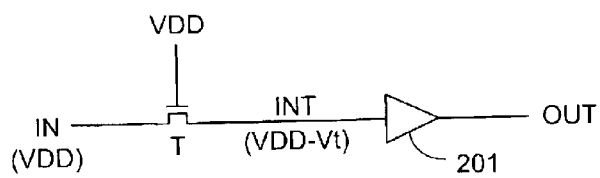
FIG. 2 shows a pass gate followed by a buffer, where the same operating voltage is used for all transistors.

In the pictured embodiment, buffer 401 is implemented as a CMOS inverter. However, many other buffer implementations can be used. For example, buffer 101x of FIG. 1 can be used to implement buffer 401. Buffer 401 uses an operating voltage of VDD, as shown in FIG. 4. The transistors P4, N4 in buffer 401 driven by internal node INT are manufactured using a thin oxide layer (see area 420 in FIG. 4).

In the pictured embodiment, memory cell C is implemented as two cross-coupled inverters (P-channel transistors P5, P6 and N-channel transistors N5, N6). However, many other memory cell implementations can be used, or the gate terminal of pass transistor G can be driven by a circuit other than a memory cell. Whether a memory cell or some other circuit is used, the circuit provides to the gate of the pass transistor either the ground value or a voltage level VGG higher than the operating voltage VDD of the buffer.

Both the pass transistor G and the memory cell C are manufactured using a thicker oxide layer than the buffer transistors (see area 410 in FIG. 4). The thicker oxide makes it possible to use a higher voltage level VGG, which in turn raises the voltage at internal node INT and causes the circuit to operate more quickly across varying process conditions than would otherwise be possible.

Figure 3:
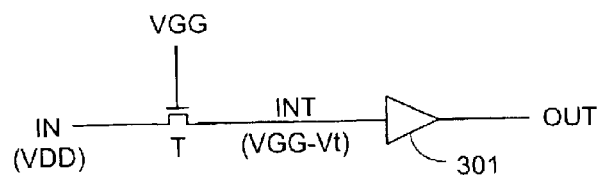
FIG. 3 shows a pass gate followed by a buffer, where two different operating voltages are used by the illustrated circuit.

As explained above in connection with FIG. 3, when a voltage value of VDD is applied to input terminal IN and a voltage value of VGG is applied to the gate of pass transistor G, the voltage at internal node INT rises to the level of VGG minus Vt (VGG−Vt) or VDD, whichever is lower, where Vt is the threshold voltage of the pass transistor. Table 2 shows the resulting voltage values for the circuit for one exemplary embodiment.

TABLE 2

| Thin Oxide | | Thick Oxide | | VINT (= VGG − |
| --- | --- | --- | --- | --- |
| VDD | Vt (thin) | VGG | Vt (thick) | Vt (thick)) |
| 1.2 V | 0.5 V | 1.5 V | 0.55 V | 0.95 V |

Comparing Table 2 to the last line of Table 1, it can be seen that by using thicker oxide for the pass transistor and raising the gate voltage to 1.5 V, the voltage at internal node INT has increased from 0.8 V to 0.95 V, thereby enhancing the performance of the circuit.

For a given source/drain voltage and oxide thickness, an IC manufacturer typically specifies a minimum gate length. The specified minimum gate is generally longer for gates with a thicker oxide. Thus, when a higher operating voltage is used, in addition to using a thicker oxide it is generally necessary to increase the gate length of any minimum-sized transistors involved. Further, when a higher voltage (e.g., VGG instead of VDD) is applied across a transistor from source to drain, leakage current increases. This leakage current can be reduced by making the transistors longer, i.e., increasing the gate length. Note that in memory cell C of FIG. 4, each transistor can have a maximum drain-source voltage of VGG. Thus, in some embodiments the transistors in area 410 (P5, N5, P6, N6, G) have a longer gate length than the transistors of area 420.

However, note also that the maximum drain-source voltage across pass transistor G is not VGG, but VDD. (The maximum voltage in this case occurs when node IN is switching levels in either direction.) Therefore, the gate length of pass transistor G need not necessarily be as long as those of memory cell transistors P5, N5, P6, and N6 to have an acceptable leakage current. Thus, in some embodiments the buffer transistors have the shortest gate length, the memory cell transistors have the longest gate length, and the pass transistor has a gate length somewhere between the two.

In some embodiments, the gate lengths of the N-channel transistors and the P-channel transistors are not the same. For example, in some embodiments leakage current is higher for N-channel devices. Therefore, in these embodiments it can be desirable to use a somewhat longer gate length for the N-channel transistors than for corresponding P-channel transistors, to reduce leakage.

Figure 5:
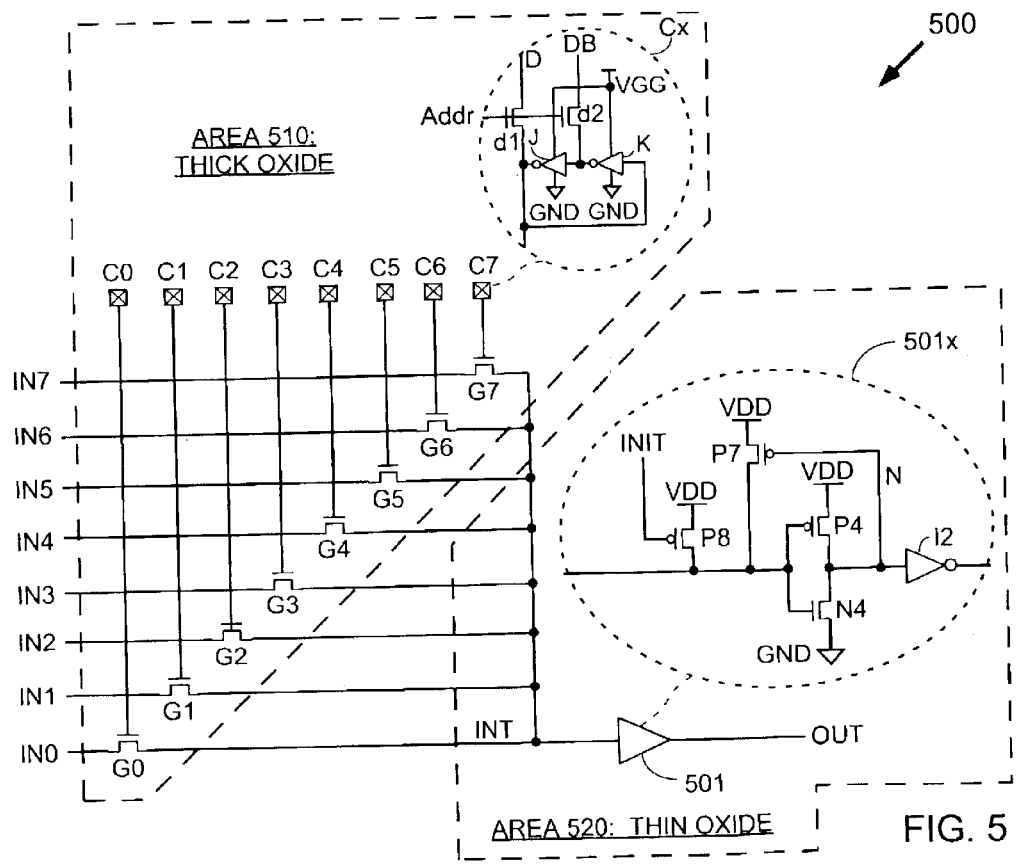
FIG. 5 shows a first multiplexer structure in an FPGA according to an embodiment of the invention.

FIG. 5 shows a multiplexer structure 500 according to one embodiment of the invention that includes some of the features shown in FIG. 4.

Buffer 501x is one embodiment of buffer 501 that can be used to implement, for example, a set of FPGA PIPs. Buffer 501x is similar to buffer 101x of FIG. 1; therefore, it is not further described here. Other buffers, such as the simple inverter 401 shown in FIG. 4, can also be used. Buffer 501 is included in area 520, where a thin oxide is used to implement the transistors. Note that the areas designated in FIGS. 4–7 do not necessarily correspond to actual physical areas of the IC, but are conceptual divisions included in the figures to simplify the process of understanding the invention.

Multiplexer structure 500 includes eight pass transistors G0–G7. However, any number of pass transistors can be used, subject to standard design considerations such as layout area and capacitance on node INT. Further, one or more levels of pass transistors can be used. Such design considerations are well known in the IC design art. Pass transistors G0–G7 and memory cells C0–C7 are included in area 510, where a thick oxide is used to implement the transistors.

Pass transistors G0–G7 are controlled by memory cells C0–C7, respectively. Memory cells C0–C7 can be implemented, for example, using two cross-coupled inverters as shown in inset Cx. Some embodiments include the configuration memory cell from the Xilinx Virtex-II Pro FPGA, with thick oxide being used to implement the cross-coupled gates and the pass transistors used to write new values to the memory cell. In a PLD, memory cells can include other well-known logic such as configuration logic, initialization logic, and/or readback logic, which are not shown in FIG. 5. In some embodiments, this additional logic is implemented using thick oxide. In other embodiments, some or all of the additional memory cell logic is implemented using the thinner oxide used in area 520.

Multiplexer structure 500 can be used, for example, to implement a set of FPGA PIPs. In these embodiments, at any given time only one of memory cells C0–C7 is programmed to enable the associated pass transistor G0–G7.

In some embodiments, the operating voltage VDD of the buffer is the same as the operating voltage used for the majority of transistors in the FPGA.

Figure 6:
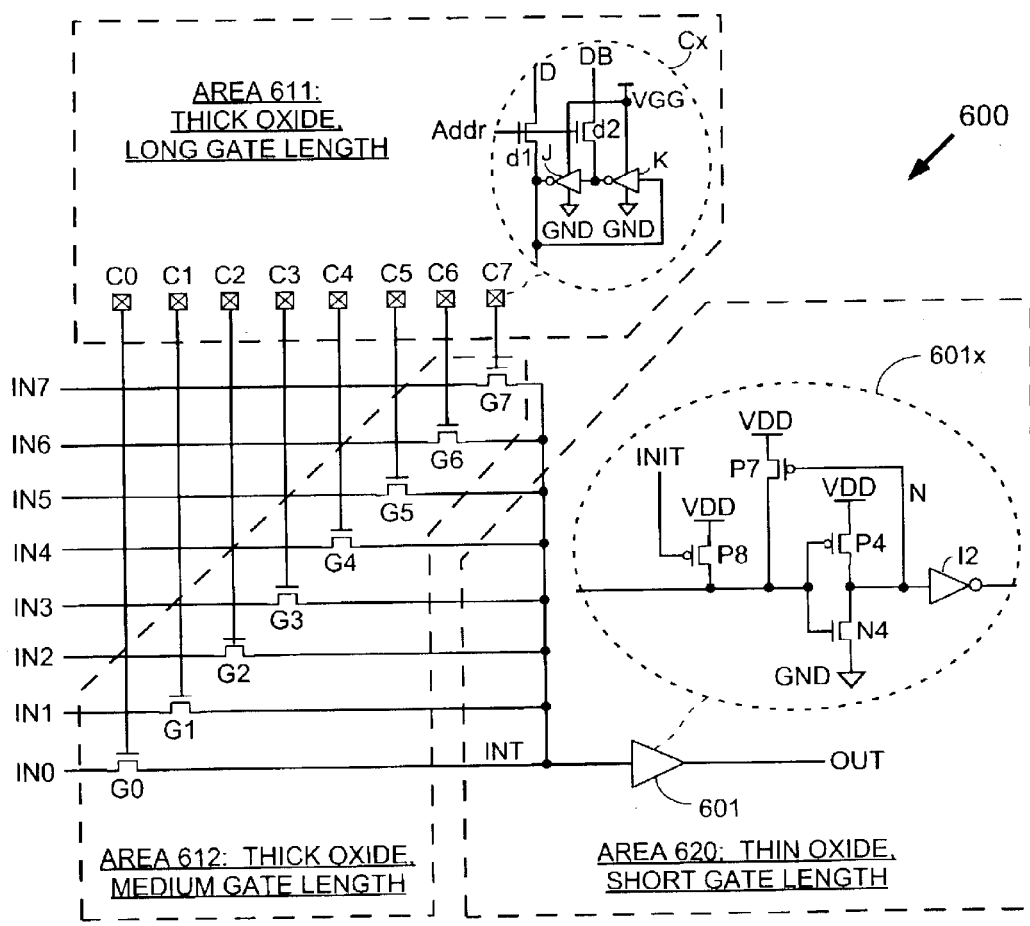
FIG. 6 shows a second multiplexer structure in an FPGA according to an embodiment of the invention.

FIG. 6 shows a multiplexer structure 600 according to one embodiment of the invention. Multiplexer structure 600 is similar to the embodiment of FIG. 5. However, the structure of FIG. 6 is divided into three separate areas rather than two.

Area 620 includes buffer 601, which includes transistors having a thin oxide and the shortest gate length. Area 611 includes memory cells C0–C7, which include transistors having a thick oxide and the longest gate length. Area 612 includes pass transistors G0–G7, which have the thick oxide and a medium gate length. As described above in conjunction with FIG. 4, it is not necessary for the gate length in area 612 to be as long as in area 611, and reducing the gate length typically improves the performance of a transistor.

Figure 7:
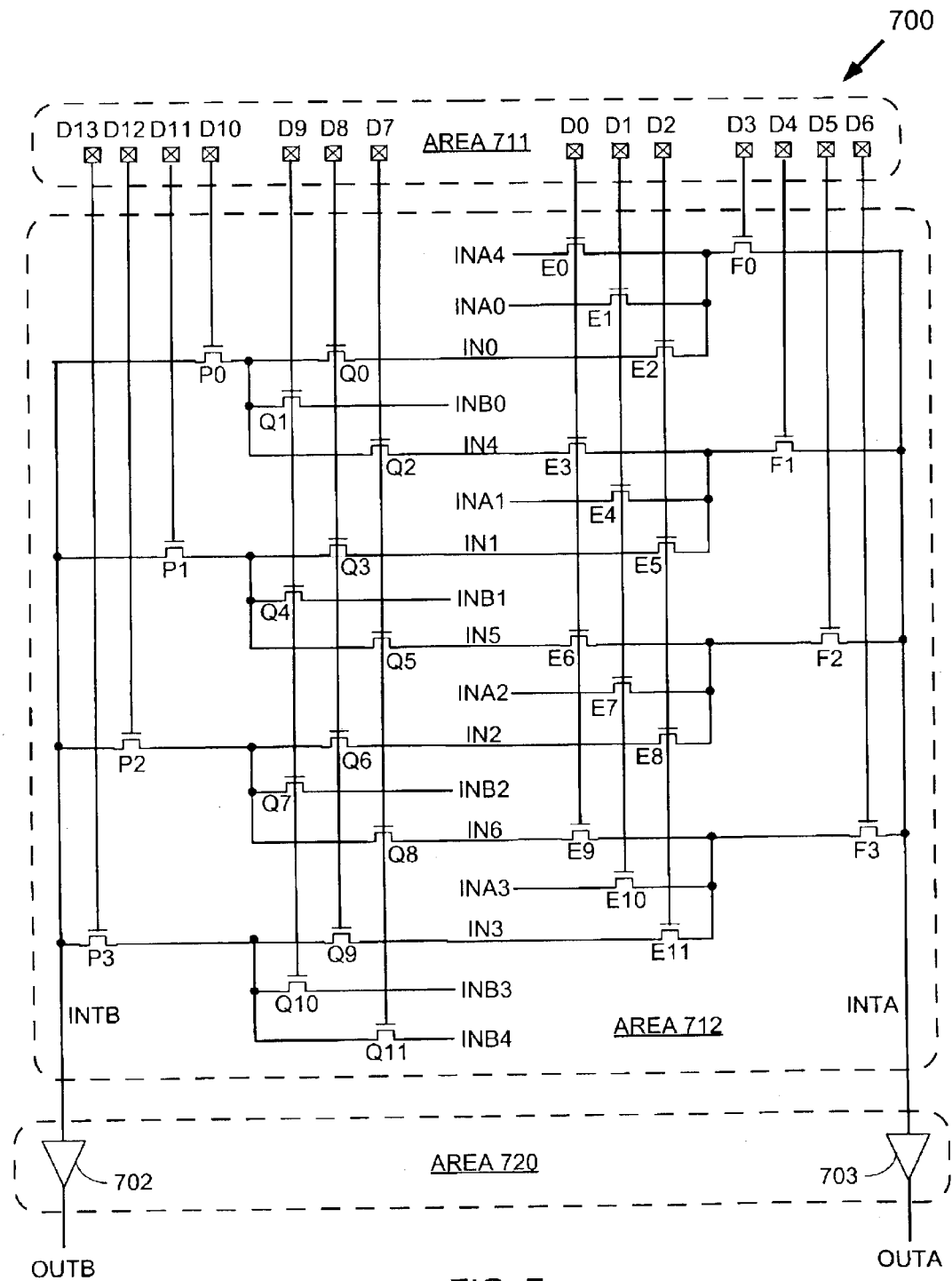
FIG. 7 shows a third multiplexer structure in an FPGA according to an embodiment of the invention.

FIG. 7 shows a multiplexer structure 700 according to another embodiment of the invention. Multiplexer structure 700 decodes 17 input signals (INA0–INA4, INB0–INB4, and IN0–IN6) under the control of 14 memory cells D0–D13 to provide two output signals OUTA and OUTB. Multiplexer structure 700 can be used, for example, to drive programmable interconnect lines in the interconnect structure of an FPGA.

Area 720 includes buffers 702, 703, which can be implemented in various ways, but in which the transistors driven by internal nodes INTB and INTA have a relatively thin oxide and short gate length. In some embodiments, the buffers are implemented in a fashion similar to buffer 601x (see FIG. 6), but using a doped N-channel transistor N4 that has a lower threshold voltage than standard N-channel transistors. This lower threshold voltage improves the speed at which node INT is pulled to VDD and reduces the delay of passing a high value though the buffer (although at the cost of a higher leakage current). The buffers operate at a first and relatively lower voltage level.

Area 711 includes memory cells D0–D13, which can also be implemented in various ways, but in which the transistors driving the gate terminals of the pass transistors use a relatively thick oxide and have a relatively long gate length. Memory cells D0–D13 operate at a second and higher voltage level than buffers 702, 703.

Area 712 includes pass transistors E0–E11, F0–3, Q0–Q11, and P0–P3. The pass transistors are implemented using the relatively thick oxide used in area 711, and have gate lengths shorter than those of areas 711 but longer than those of area 720. The pass transistors operate at (i.e., their gate terminals are driven by) the second and higher voltage level.

Table 3 shows the operating voltage, oxide thickness, maximum source/drain voltage, and gate length used in one embodiment for each area of FIG. 7. The term "operating voltage" as applied to pass transistors as used in Table 3 denotes the high voltage supplied to the gate terminal of the pass transistor. The oxide thicknesses are measured in nanometers (nm).

TABLE 3

| Area | Operating Voltage | Oxide Thickness | Source/Drain Voltage | Gate Length |
| --- | --- | --- | --- | --- |
| 711 | 1.5 V | 2.2 nm | 1.5 V | 0.12 microns |
| 712 | 1.5 V | 2.2 nm | 1.2 V | 0.09 microns |
| 720 | 1.2 V | 1.3 nm | 1.2 V | 0.08 microns |

In some PLD embodiments, the pass transistors are not controlled directly by the memory cells. Instead, fewer memory cells are used, and the values stored in the memory cells are decoded to provide the gate control signals to the pass transistors.

In some embodiments, the multiplexer structures of the invention are included in an IC manufactured using three different oxide thicknesses. The thinnest oxide is used for the buffers in the multiplexer structures (and for other circuits in the device as well). The medium-thickness oxide is used for the pass transistors and memory cells in the multiplexer structures. The thickest oxide is used in the input/output (I/O) structures.

It is well known to use a thicker oxide in the I/O structures of integrated circuits. It is not uncommon for input signals provided to an IC to have a high voltage value that is greater than the core operating voltage of the device. For example, ICs with a core operating voltage of 1.5 V and a VGG value of 1.6 volts might be required to interface with other ICs that provide and receive signals at 2.5 volts. To support these higher voltages, I/O structures are commonly manufactured with a much thicker oxide than the internal structures of the IC.

However, it is not generally desirable to use this much thicker oxide in internal structures such as the multiplexer structures provided herein. The much thicker oxide requires very large transistors and generally results in much worse performance than the medium-thickness oxide described herein.

Those having skill in the relevant arts of the invention will now perceive various modifications and additions that can be made as a result of the disclosure herein. For example, the above text describes the structures of the invention in the context of ICs such as programmable logic devices (PLDs) and field programmable gate arrays (FPGAs). However, the structures of the invention can also be implemented in other integrated circuits, including non-programmable circuits. Additionally, in PLDs and FPGAs the structures are described in the context of programmable interconnect points (PIPs) between the interconnect lines and configurable logic blocks (CLBs) of the device. However, the structures of the invention can also be included in other circuits and for other purposes.

Further, buffers, memory cells, pass transistors, P-channel transistors, N-channel transistors, pullups, pulldowns, multiplexers, multiplexer structures, interconnect structures, PIPS, configurable logic blocks, FPGAs, PLDs, ICs, and other components other than those described herein can be used to implement the invention. Active-high signals can be replaced with active-low signals by making straightforward alterations to the circuitry, such as are well known in the art of circuit design. Logical circuits can be replaced by their logical equivalents by appropriately inverting input and output signals, as is also well known.

Moreover, some components are shown directly connected to one another while others are shown connected via intermediate components. In each instance the method of interconnection establishes some desired electrical communication between two or more circuit nodes. Such communication can often be accomplished using a number of circuit configurations, as will be understood by those of skill in the art.

Accordingly, all such modifications and additions are deemed to be within the scope of the invention, which is to be limited only by the appended claims and their equivalents.

What is claimed is:

1. A multiplexer structure in an integrated circuit (IC), comprising:
    a plurality of input terminals;
    an internal node;
    an output terminal;
    a plurality of pass transistors coupled between the input terminals and the internal node; and
    a buffer coupled between the internal node and the output terminal,
    wherein:
        each of the pass transistors has a gate terminal coupled to provide to the pass transistor a selected one of a ground signal and a power high signal at a first voltage level;
        each of the pass transistors has a first oxide thickness;
        the buffer is coupled to an operating voltage at a second voltage level less than the first voltage level; and
        the buffer comprises buffer transistors having a second oxide thickness, where the second oxide thickness is less than the first oxide thickness.

2. The multiplexer structure of claim 1, wherein:
    each of the pass transistors has a first gate length;
    the buffer transistors have a second gate length; and
    the first gate length is longer than the second gate length.

3. The multiplexer structure of claim 1, wherein the second voltage level is an operating voltage used as a supply voltage by a majority of transistors in the IC.

4. The multiplexer structure of claim 1, further comprising a plurality of memory cells, and wherein:
    the gate terminal of each pass transistor is coupled to an output terminal of one of the memory cells;
    each of the memory cells is coupled to an operating voltage at the first voltage level; and
    each of the memory cells comprises memory cell transistors having the first oxide thickness.

5. The multiplexer structure of claim 4, wherein the IC is a programmable logic device (PLD).

6. The multiplexer structure of claim 4, wherein:
    the IC is a field programmable gate array (FPGA); and
    the multiplexer structure implements a set of programmable interconnect points (PIPs) in the FPGA.

7. The multiplexer structure of claim 4, wherein:
    each of the pass transistors has a first gate length;
    the buffer transistors have a second gate length;
    the memory cell transistors have the first gate length; and
    the first gate length is longer than the second gate length.

8. The multiplexer structure of claim 4, wherein:
    each of the pass transistors has a first gate length;
    the buffer transistors have a second gate length;
    the memory cell transistors have a third gate length;
    the first gate length is longer than the second gate length; and
    the third gate length is longer than the first gate length.

9. The multiplexer structure of claim 4, wherein the pass transistors, the buffer transistors, and the memory cell transistors all have the same gate length.

10. A circuit, comprising:
    an input terminal;
    an internal node;
    an output terminal;
    a pass transistor coupled between the input terminal and the internal node; and
    a buffer coupled between the internal node and the output terminal,
    wherein:
        the pass transistor has a gate terminal coupled to provide to the pass transistor a selected one of a ground signal and a power high signal at a first voltage level;
        the pass transistor has a first oxide thickness;

the buffer is coupled to an operating voltage at a second voltage level less than the first voltage level; and the buffer comprises buffer transistors having a second oxide thickness, where the second oxide thickness is less than the first oxide thickness.

11. The circuit of claim 10, wherein:

the pass transistor has a first gate length;

the buffer transistors have a second gate length; and the first gate length is longer than the second gate length.

12. The circuit of claim 10, further comprising a memory cell, and wherein:

the gate terminal of the pass transistor is coupled to an output terminal of the memory cell;

the memory cell is coupled to an operating voltage at the first voltage level; and the memory cell comprises memory cell transistors having the first oxide thickness.

13. The circuit of claim 12, wherein:

the pass transistor has a first gate length;

the buffer transistors have a second gate length;

the memory cell transistors have the first gate length; and the first gate length is longer than the second gate length.

14. The circuit of claim 12, wherein:

the pass transistor has a first gate length;

the buffer transistors have a second gate length;

the memory cell transistors have a third gate length;

the first gate length is longer than the second gate length; and the third gate length is longer than the first gate length.

15. The circuit of claim 12, wherein the pass transistor, the buffer transistors, and the memory cell transistors all have the same gate length.

16. An interconnect structure for a programmable logic device (PLD), comprising:

a plurality of interconnect lines; and a first plurality of programmable interconnect points (PIPs) coupled between the interconnect lines, wherein each of the first plurality of PIPs comprises:

a plurality of input terminals coupled to a subset of the interconnect lines;

an internal node;

an output terminal coupled to one of the interconnect lines;

a plurality of pass transistors coupled between the input terminals and the internal node; and a buffer coupled between the internal node and the output terminal, wherein:

each of the pass transistors has a gate terminal coupled to provide to the pass transistor a selected one of a ground signal and a power high signal at a first voltage level;

each of the pass transistors has a first oxide thickness;

the buffer is coupled to an operating voltage at a second voltage level less than the first voltage level; and the buffer comprises buffer transistors having a second oxide thickness, where the second oxide thickness is less than the first oxide thickness.

17. The interconnect structure of claim 16, wherein in each of the first plurality of PIPs:

each of the pass transistors has a first gate length;

the buffer transistors have a second gate length; and the first gate length is longer than the second gate length.

18. The interconnect structure of claim 16, wherein in each of the first plurality of PIPs the second voltage level is an operating voltage used as a supply voltage by a majority of transistors in the PLD.

19. The interconnect structure of claim 16, wherein each of the first plurality of PIPs further comprises a plurality of memory cells, and wherein in each of the first plurality of PIPs:

the gate terminal of each pass transistor is coupled to an output terminal of one of the memory cells;

each of the memory cells is coupled to an operating voltage at the first voltage level; and each of the memory cells comprises memory cell transistors having the first oxide thickness.

20. The interconnect structure of claim 19, further comprising a second plurality of PIPs coupled between the interconnect lines, wherein each of the second plurality of PIPs comprises a plurality of pass transistors having the second oxide thickness.

21. The interconnect structure of claim 19, wherein the PLD is a field programmable gate array (FPGA).

22. The interconnect structure of claim 19, wherein in each of the first plurality of PIPs:

each of the pass transistors has a first gate length;

the buffer transistors have a second gate length;

the memory cell transistors have the first gate length; and the first gate length is longer than the second gate length.

23. The interconnect structure of claim 19, wherein in each of the first plurality of PIPs:

each of the pass transistors has a first gate length;

the buffer transistors have a second gate length;

the memory cell transistors have a third gate length;

the first gate length is longer than the second gate length; and the third gate length is longer than the first gate length.

24. The interconnect structure of claim 19, wherein in each of the first plurality of PIPs the pass transistors, the buffer transistors, and the memory cell transistors all have the same gate length.

25. A field programmable gate array (FPGA), comprising:

a plurality of configurable logic blocks;

a plurality of interconnect lines; and a first plurality of programmable interconnect points (PIPs) coupled between the interconnect lines and the configurable logic blocks, wherein each of the first plurality of PIPs comprises:

a plurality of input terminals coupled to a subset of the interconnect lines;

an internal node;

an output terminal coupled to one of the interconnect lines;

a plurality of pass transistors coupled between the input terminals and the internal node; and a buffer coupled between the internal node and the output terminal, wherein:

each of the pass transistors has a gate terminal coupled to provide to the pass transistor a selected one of a ground signal and a power high signal at a first voltage level;

each of the pass transistors has a first oxide thickness;

the buffer is coupled to an operating voltage at a second voltage level less than the first voltage level; and the buffer comprises buffer transistors having a second oxide thickness, where the second oxide thickness is less than the first oxide thickness.

26. The FPGA of claim 25, wherein in each of the first plurality of PIPS:

each of the pass transistors has a first gate length;
the buffer transistors have a second gate length; and
the first gate length is longer than the second gate length.

27. The FPGA of claim 25, wherein in each of the first plurality of PIPs the second voltage level is an operating voltage used as a supply voltage by a majority of transistors in the FPGA.

28. The FPGA of claim 25, wherein each of the first plurality of PIPs further comprises a plurality of memory cells, and wherein in each of the first plurality of PIPs:

the gate terminal of each pass transistor is coupled to an output terminal of one of the memory cells;
each of the memory cells is coupled to an operating voltage at the first voltage level; and
each of the memory cells comprises memory cell transistors having the first oxide thickness.

29. The FPGA of claim 28, further comprising a second plurality of PIPs coupled between the interconnect lines, wherein each of the second plurality of PIPs comprises a plurality of pass transistors having the first oxide thickness.

30. The FPGA of claim 28, further comprising a second plurality of PIPs coupled between the interconnect lines, wherein each of the second plurality of PIPs comprises a plurality of pass transistors having the second oxide thickness.

31. The FPGA of claim 28, wherein in each of the first plurality of PIPs:

each of the pass transistors has a first gate length;
the buffer transistors have a second gate length;
the memory cell transistors have the first gate length; and
the first gate length is longer than the second gate length.

32. The FPGA of claim 28, wherein in each of the first plurality of PIPs:

each of the pass transistors has a first gate length;
the buffer transistors have a second gate length;
the memory cell transistors have a third gate length;
the first gate length is longer than the second gate length; and
the third gate length is longer than the first gate length.

33. The FPGA of claim 28, wherein in each of the first plurality of PIPs the pass transistors, the buffer transistors, and the memory cell transistors all have the same gate length.

34. A field programmable gate array (FPGA), comprising:

a plurality of configurable logic blocks;
a plurality of input/output blocks;
a plurality of interconnect lines of which at least a subset are coupled to the input/output blocks; and
a first plurality of programmable interconnect points (PIPs) coupled between the interconnect lines and the configurable logic blocks,
wherein each of the first plurality of PIPs comprises:
a plurality of input terminals coupled to a subset of the interconnect lines;
an internal node;
an output terminal coupled to one of the interconnect lines;
a plurality of pass transistors coupled between the input terminals and the internal node; and
a buffer coupled between the internal node and the output terminal,
wherein:
each of the pass transistors has a gate terminal coupled to provide to the pass transistor a selected one of a ground signal and a power high signal at a first voltage level;
each of the pass transistors has a first oxide thickness;
the buffer is coupled to an operating voltage at a second voltage level less than the first voltage level; and
the buffer comprises buffer transistors having a second oxide thickness, where the second oxide thickness is less than the first oxide thickness,
and wherein the input/output blocks each comprise input/output transistors having a third oxide thickness greater than the first oxide thickness.

35. The FPGA of claim 34, wherein in each of the first plurality of PIPs:

each of the pass transistors has a first gate length;
the buffer transistors have a second gate length; and
the first gate length is longer than the second gate length.

36. The FPGA of claim 34, wherein in each of the first plurality of PIPs the second voltage level is an operating voltage used as a supply voltage by a majority of transistors in the FPGA.

37. The FPGA of claim 34, wherein each of the first plurality of PIPs further comprises a plurality of memory cells, and wherein in each of the first plurality of PIPs:

the gate terminal of each pass transistor is coupled to an output terminal of one of the memory cells;
each of the memory cells is coupled to an operating voltage at the first voltage level; and
each of the memory cells comprises memory cell transistors having the first oxide thickness.

38. The FPGA of claim 37, further comprising a second plurality of PIPs coupled between the interconnect lines, wherein each of the second plurality of PIPs comprises a plurality of pass transistors having the first oxide thickness.

39. The FPGA of claim 37, further comprising a second plurality of PIPs coupled between the interconnect lines, wherein each of the second plurality of PIPs comprises a plurality of pass transistors having the second oxide thickness.

40. The FPGA of claim 37, wherein in each of the first plurality of PIPs:

each of the pass transistors has a first gate length;
the buffer transistors have a second gate length;
the memory cell transistors have the first gate length; and
the first gate length is longer than the second gate length.

41. The FPGA of claim 37, wherein in each of the first plurality of PIPs:

each of the pass transistors has a first gate length;
the buffer transistors have a second gate length;
the memory cell transistors have a third gate length;
the first gate length is longer than the second gate length; and
the third gate length is longer than the first gate length.

42. The FPGA of claim 37, wherein in each of the first plurality of PIPs the pass transistors, the buffer transistors, and the memory cell transistors all have the same gate length.

43. An integrated circuit (IC), comprising:

a plurality of input/output blocks;

a plurality of interconnect lines of which at least a subset are coupled to the input/output blocks; and a multiplexer structure coupled to the interconnect lines, the multiplexer structure comprising:

a plurality of input terminals coupled to a subset of the interconnect lines;

an internal node;

an output terminal coupled to one of the interconnect lines;

a plurality of pass transistors coupled between the input terminals and the internal node; and a buffer coupled between the internal node and the output terminal, wherein:

each of the pass transistors has a gate terminal coupled to provide to the pass transistor a selected one of a ground signal and a power high signal at a first voltage level;

each of the pass transistors has a first oxide thickness;

the buffer is coupled to an operating voltage at a second voltage level less than the first voltage level; and the buffer comprises buffer transistors having a second oxide thickness, where the second oxide thickness is less than the first oxide thickness, and wherein the input/output blocks each comprise input/output transistors having a third oxide thickness greater than the first oxide thickness.

44. The IC of claim 43, wherein the IC is a programmable logic device.

45. The IC of claim 43, wherein:

each of the pass transistors has a first gate length;

the buffer transistors have a second gate length; and the first gate length is longer than the second gate length.

46. The IC of claim 43, wherein the second voltage level is an operating voltage used as a supply voltage by a majority of transistors in the IC.

* * * * *